(12) United States Patent
Robin et al.

(10) Patent No.: US 12,310,147 B2
(45) Date of Patent: May 20, 2025

(54) OPTOELECTRONIC DEVICE COMPRISING LIGHT-EMITTING DIODES HAVING MULTIPLE QUANTUM WELLS

(71) Applicant: Aledia, Echirolles (FR)

(72) Inventors: Ivan-Christophe Robin, Grenoble (FR); Wei-Sin Tan, Grenoble (FR); Frédéric Mayer, Voiron (FR)

(73) Assignee: Aledia, Echirolles (FR)

( * ) Notice: Subject to any disclaimer, the term of this patent is extended or adjusted under 35 U.S.C. 154(b) by 652 days.

(21) Appl. No.: 17/609,357

(22) PCT Filed: May 18, 2020

(86) PCT No.: PCT/FR2020/050819
§ 371 (c)(1),
(2) Date: Nov. 5, 2021

(87) PCT Pub. No.: WO2020/234534
PCT Pub. Date: Nov. 26, 2020

(65) Prior Publication Data
US 2022/0320367 A1    Oct. 6, 2022

(30) Foreign Application Priority Data
May 21, 2019   (FR) ...................................... 1905332

(51) Int. Cl.
*H10H 20/812*      (2025.01)
*H01L 25/16*       (2023.01)
(Continued)

(52) U.S. Cl.
CPC ......... *H10H 20/812* (2025.01); *H01L 25/167* (2013.01); *H10H 20/8162* (2025.01); *H10H 20/825* (2025.01); *H10H 20/857* (2025.01)

(58) Field of Classification Search
None
See application file for complete search history.

(56) References Cited

U.S. PATENT DOCUMENTS

2015/0063395 A1    3/2015  Avramescu et al.
2015/0380461 A1*  12/2015  Robin ............... H01L 31/03529
                                                            257/459
(Continued)

FOREIGN PATENT DOCUMENTS

EP          2 960 951 A1     12/2015
EP          3 185 294 A1      6/2017
WO     WO 2017/216445 A1     12/2017

OTHER PUBLICATIONS

International Search Report and Written Opinion for International Application No. PCT/FR2020/050819, mailed Sep. 25, 2020.

*Primary Examiner* — Daniel Whalen
(74) *Attorney, Agent, or Firm* — Wolf, Greenfield & Sacks, P.C.

(57) ABSTRACT

An optoelectronic device including at least first and second light-emitting diodes, each including a first P-type doped semiconductor portion and a second N-type doped semiconductor portion, an active area including multiple quantum wells between the first and second semiconductor portions, a conductive layer covering the lateral walls of the active area and of at least a portion of the first semiconductor portion, and an insulating layer interposed between the lateral walls of the active area and of at least a portion of the conductive layer. The device includes means for controlling the conductive layer of the first light-emitting diode independently from the conductive layer of the second light-emitting diode.

15 Claims, 12 Drawing Sheets

(51) Int. Cl.
*H10H 20/816* (2025.01)
*H10H 20/825* (2025.01)
*H10H 20/857* (2025.01)

(56) References Cited

U.S. PATENT DOCUMENTS

2016/0141449 A1* 5/2016 Robin ................... H01L 33/04
                                                    438/22
2021/0234065 A1* 7/2021 Fan ..................... H01L 33/32

* cited by examiner

OPTOELECTRONIC DEVICE COMPRISING LIGHT-EMITTING DIODES HAVING MULTIPLE QUANTUM WELLS

This Application is a national stage filing under 35 U.S.C. 371 of International Patent Application Serial No. PCT/FR2020/050819, filed May 18, 2020, which claims priority to French patent application FR19/05332, filed May 21, 2019. The contents of these applications are incorporated herein by reference in their entirety.

TECHNICAL BACKGROUND

The present disclosure relates to an optoelectronic device, particularly a display screen or an image projection device, comprising light-emitting diodes made up of semiconductor materials and their manufacturing methods.

PRIOR ART

A pixel of an image corresponds to the unit element of the image displayed by the optoelectronic device. When the optoelectronic device is a color image display screen, it generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device. Each display sub-pixel may comprise at least one light-emitting diode.

It may be advantageous to simultaneously form a plurality of light-emitting diodes by same steps of a same manufacturing method, particularly for cost reasons. The active areas of the light-emitting diodes will then emit an electromagnetic radiation at the same wavelength. To obtain display sub-pixels emitting electromagnetic radiations at different wavelengths, a possibility is to cover certain light-emitting diodes with a layer of phosphors capable of converting the electromagnetic radiation emitted by the light-emitting diode into an electromagnetic radiation at a different wavelength. However, it may be difficult to accurately obtain the desired colors. Further, the cost of the phosphors may be high.

There thus is a need for an optoelectronic device comprising light-emitting diodes comprising display sub-pixels emitting electromagnetic radiations at different wavelengths where the use of phosphors is decreased, or even suppressed.

Further, for certain applications, there is a need to control the turning-on and the turning-off of a light-emitting diode without modifying the voltage applied between the electrodes of the light-emitting diode.

SUMMARY

Thus, an object of an embodiment is to at least partly overcome the disadvantages of the previously-described optoelectronic devices comprising light-emitting diodes.

Another object of an embodiment is to decrease, or even to suppress, the use of phosphors.

Another object of an embodiment is to be able to simultaneously form by common steps a plurality of light-emitting diodes capable of emitting electromagnetic radiations at different wavelengths.

Another object of an embodiment is for optoelectronic devices to be capable of being manufactured at an industrial scale and at a low cost.

For this purpose, an embodiment provides an optoelectronic device comprising at least first and second light-emitting diodes, each comprising a first P-type doped semiconductor portion and a second N-type doped semiconductor portion, an active area comprising multiple quantum wells between the first and second semiconductor portions, a conductive layer covering the lateral walls of the active area and at least a portion of the first semiconductor portion and an insulating layer interposed between the lateral walls of the active area and of at least a portion of the conductive layer, the device comprising means for controlling the conductive layer of the first light-emitting diode independently from the conductive layer of the second light-emitting diode, the optoelectronic device comprising, for each of the first and second light-emitting diodes, a first conductive pad electrically coupled to the first semiconductor portion, a second conductive pad electrically coupled to the second semiconductor portion, and a third conductive pad electrically coupled to the conductive layer.

According to an embodiment, for each of the first and second light-emitting diodes, the active area comprises multiple quantum wells.

According to an embodiment, for each active area, the composition of the quantum well closest to the first semiconductor portion is different from the composition of the quantum well closest to the second semiconductor portion.

According to an embodiment, for each active area, each quantum well comprises a ternary compound with first, second, and third chemical elements. The mass concentrations of the first chemical element of the quantum wells are identical. The mass concentrations of the second chemical element of the quantum wells are identical, and the mass concentration of the third chemical element of the quantum well closest to the first semiconductor portion is different from the mass concentration of the third chemical element of the quantum well closest to the second semiconductor portion.

According to an embodiment, the difference between the mass concentration of the third chemical element of the quantum well closest to the first semiconductor portion and the mass concentration of the third chemical element of the quantum well closest to the second semiconductor portion is greater than 10 percentage points.

According to an embodiment, the first chemical element is a group-III element.

According to an embodiment, the first chemical element is gallium.

According to an embodiment, the second chemical element is a group-V element.

According to an embodiment, the second chemical element is nitrogen.

According to an embodiment, the third chemical element is a group-III element.

According to an embodiment, the third chemical element is indium.

According to an embodiment, each light-emitting diode has a "mesa" structure.

According to an embodiment, for each light-emitting diode, the second semiconductor portion is wire-shaped.

According to an embodiment, each light-emitting diode further comprises, between the active area and the first semiconductor portion, an electron blocking layer. According to an embodiment, the first and second conductive pads are electrically insulated from the conductive layer.

An embodiment also provides a method of light emission from an optoelectronic device such as previously defined, comprising the application of a first electric voltage between the first and second semiconductor portions of each of the first and second light-emitting diodes, the application of a second electric voltage between the conductive layer and the first semiconductor portion of the first light-emitting diode, and the application of a third electric voltage between the conductive layer and the first semiconductor portion of the second light-emitting diode, the third electric voltage being different from the second electric voltage.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
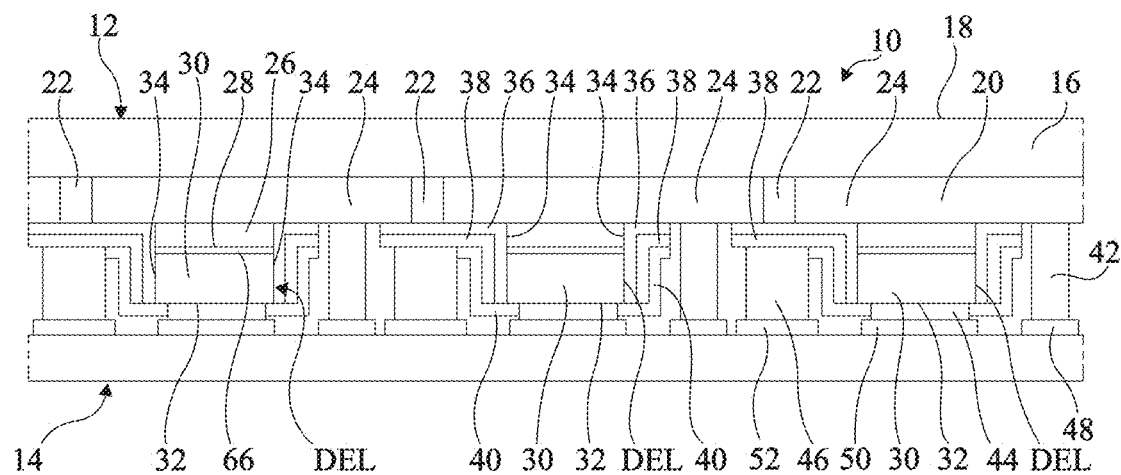
FIG. 1 shows an embodiment of an optoelectronic device comprising light-emitting diodes.

The same elements have been designated with the same reference numerals in the different drawings and, further, as usual in the representation of electronic circuits, the various drawings are not to scale. In particular, the structural and/or functional features that are common among the various embodiments may have the same references and may dispose identical structural, dimensional and material properties. Further, only those elements which are useful to the understanding of the present description have been shown and will be described. In particular, the structure of a light-emitting diode is well known by those skilled in the art and has not been described in detail.

In the following description, when reference is made to terms qualifying the relative position, such as terms "upper", "lower", etc., reference is made to the orientation of the drawings or to an optoelectronic device in a normal position of use. Unless specified otherwise, the expressions "substantially", "about", "approximately", and "in the order of" signify within 10%, and preferably within 5%. Further, the "active area" of a light-emitting diode designates the region of the light-emitting diode from which most of the electromagnetic radiation provided by the light-emitting diode is emitted. Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively mean "electrically insulating" and "electrically conductive".

FIG. 1 is a partial simplified cross-section view of an embodiment of an optoelectronic device 10 capable of emitting light. According to an embodiment, optoelectronic device 10 comprises at least two electronic circuits 12 and 14. First circuit 12 comprises light-emitting diodes DEL. Second circuit 14 comprises electronic components, not shown, particularly transistors, used for the control of the light-emitting diodes of first circuit 12. First circuit 12 is bonded to second circuit 14, for example, by molecular bonding or by a flip-chip type connection, particularly, a ball or microtube flip-chip method. First integrated circuit 12 is called optoelectronic circuit or optoelectronic chip in the following description and second integrated circuit 14 may be an integrated circuit and is called control circuit or control chip in the following description.

Optoelectronic device 10 is intended, in operation, to emit light upwards. Optoelectronic circuit 12 comprises, from top to bottom in FIG. 1:

a substrate 16, for example, an insulating substrate, at least partially transparent to the electromagnetic radiations emitted by the light-emitting diodes and which delimits an emission surface 18 of optoelectronic device 10, substrate being possibly absent;

a doped semiconductor layer 20 of a first conductivity type, at least partially transparent to the electromagnetic radiations emitted by light-emitting diodes DEL;

lateral insulation trenches 22 which extend across the entire thickness of semiconductor layer 20 and which delimit portions of substrate 24 in semiconductor layer 20, three substrate portions 24 being shown in FIG. 1, lateral insulation trenches 22 being possibly absent;

for each substrate portion 24, at least one light-emitting diode DEL, each light-emitting diode DEL comprising an upper semiconductor portion 26 in contact with the corresponding substrate portion 24, an active area 28, and a lower semiconductor portion 30, active area 28 being interposed between upper semiconductor portion 26 and lower semiconductor portion 30, lower semiconductor portion 30 comprising a lower surface 32 on the side opposite to active area 28, the stack comprising upper semiconductor portion 26, active area 28, and lower semiconductor portion 30 forming an island delimited by lateral walls 34 and lower surface 32;

for each light-emitting diode DEL, an insulating layer 36 covering substrate portion 24 around light-emitting diode DEL and covering the lateral walls 34 of light-emitting diode DEL;

for each light-emitting diode DEL, a conductive layer 38, called gate hereafter, covering insulating layer 36;

for each light-emitting diode DEL, an insulating layer 40 covering gate 38 and a portion of the lower surface 32 of lower semiconductor portion 30, insulating layer 40 being possibly absent; and for each light-emitting diode DEL, a first conductive pad 42 in contact with the corresponding substrate portion 24, a second conductive pad 44 in contact with the lower surface 32 of low semiconductor portion 30, and a third conductive pad 46 in contact with gate 38.

Control chip 14 comprises, on the side of optoelectronic circuit 12, for each light-emitting diode DEL, three conductive pads 48, 50, 52, conductive pad 48 being connected to conductive pad 42, conductive pad 50 being connected to conductive pad 44, and conductive pad 52 being connected to conductive pad 46. In the case where control chip 14 is bonded to optoelectronic circuit 12 by molecular bonding, conductive pads 48, 50, 52 may be in contact with conductive pads 42, 44, 46. In the case where control chip 14 is bonded to optoelectronic circuit 12 by a "flip-chip"-type connection, solder balls or microtubes may be interposed between conductive pads 42, 44, 46 and conductive pads 48, 50, 52.

In the embodiment shown in FIG. 1, each light-emitting diode DEL is said to be of "mesa" type, that is, it comprises a stack of planar layers which has been etched to form an island.

Figure 2:
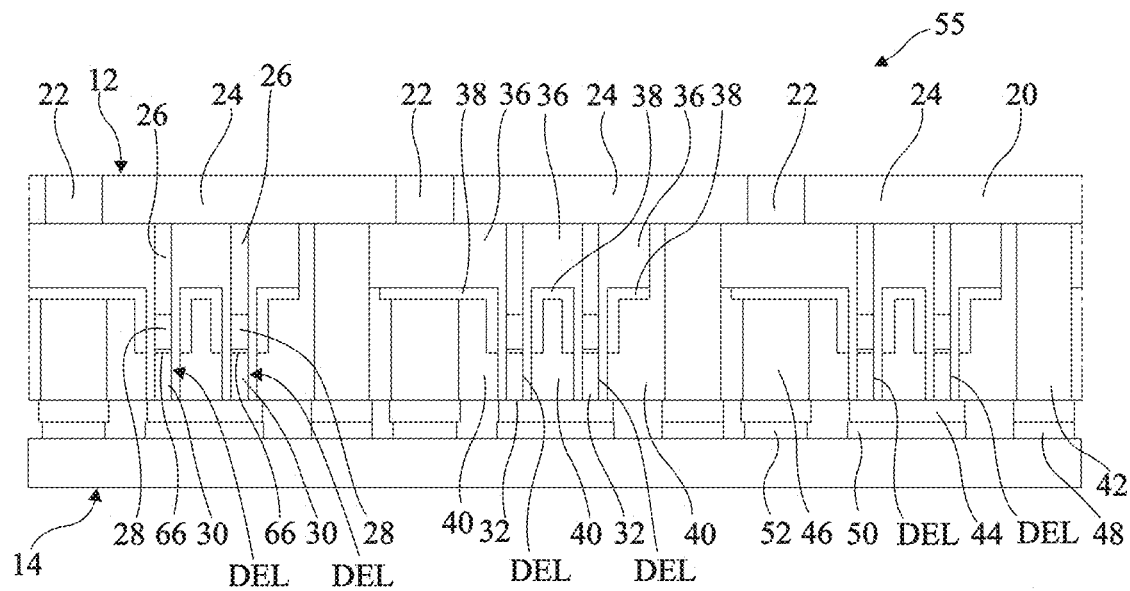
FIG. 2 shows another embodiment of an optoelectronic device.

FIG. 2 is a partial simplified cross-section view of another embodiment of an optoelectronic device 55 capable of emitting light. Optoelectronic device 55 comprises all the elements of the optoelectronic device 10 shown in FIG. 1, with the difference that substrate 16 is not present and that each light-emitting diode DEL is of axial type, that is, the lower and upper semiconductor portions 26 and 30 have been manufactured in the form of wires. FIG. 2 shows two light-emitting diodes DEL for each substrate portion 24, the associated conductive pad 44 being connected to the lower semiconductor portions 30 of each of the two light-emitting diodes DEL.

Figure 3:
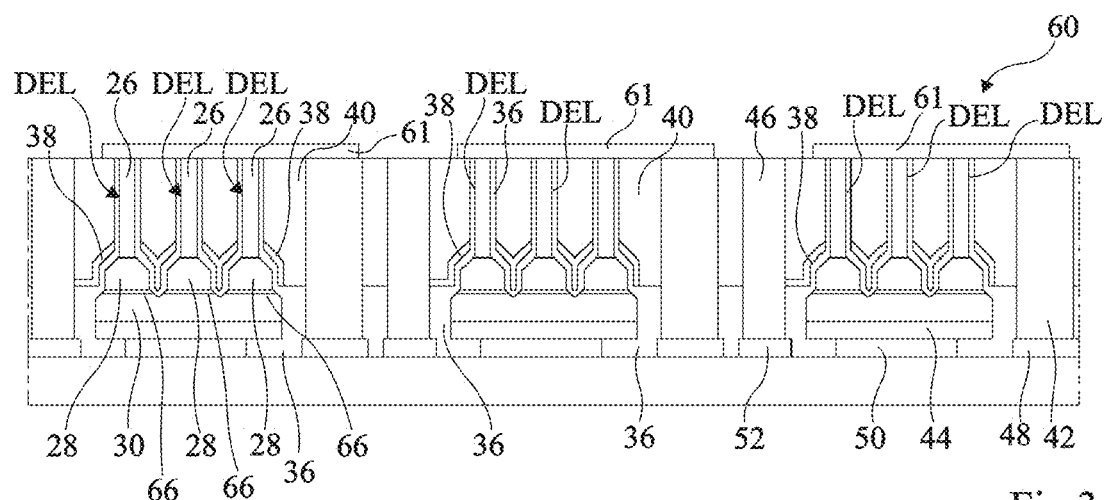
FIG. 3 shows another embodiment of an optoelectronic device.

FIG. 3 is a partial simplified cross-section view of another embodiment of an optoelectronic device 60 capable of emitting light. Optoelectronic device 60 comprises all the elements of the optoelectronic device 10 shown in FIG. 1, with the difference that substrate 16 and semiconductor layer 20 are not present. Further, light-emitting diodes DEL are distributed in groups of at least two light-emitting diodes DEL and, for each light-emitting diode DEL, the upper semiconductor portion 26 is wire shaped, the active area 28 has at least partially a conical or frustoconical shape which flares from upper semiconductor portion 26, and the lower semiconductor portion 30 is common for the light-emitting diodes DEL of a same group. Further, for each light-emitting diode DEL, conductive pad 42 is electrically coupled to the upper semiconductor portion 26 by a conductive element 61.

Figure 4:
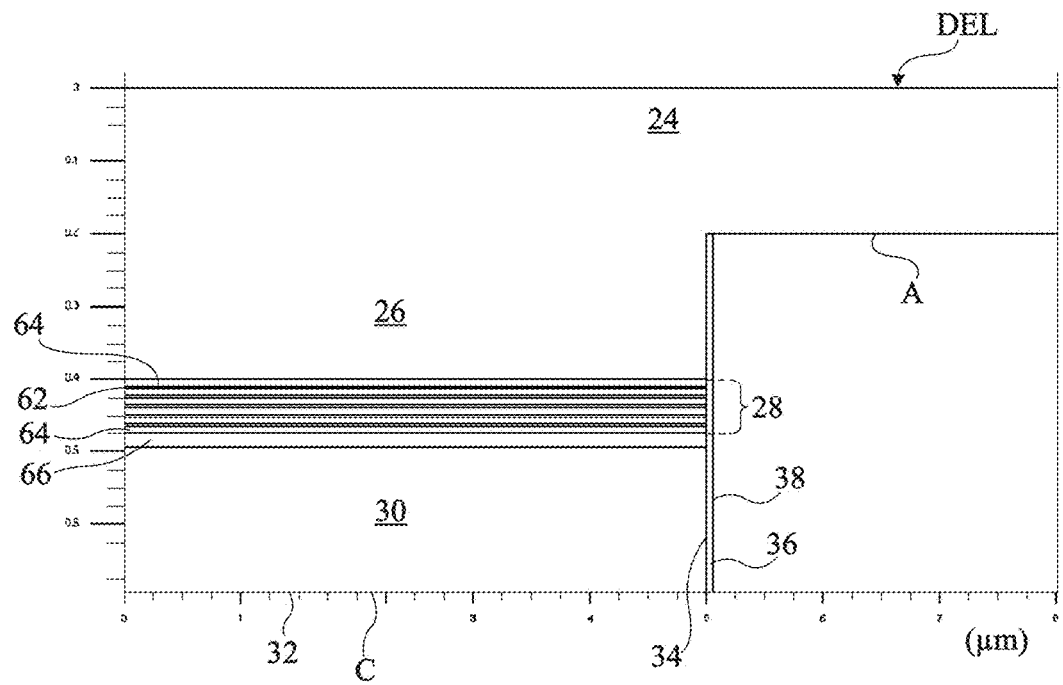
FIG. 4 shows an embodiment of a light-emitting diode used to perform simulations.

FIG. 4 is a more detailed partial simplified cross-section view of light-emitting diode DEL. According to an embodiment, active area 28 is the layer from which most of the electromagnetic radiation delivered by optoelectronic circuit 12 is emitted. According to an embodiment, active area 28 comprises multiple quantum wells. It then comprises an alternation of first semiconductor layers 62, called quantum well layers, and of second semiconductor layers 64, called barrier layers, each quantum well layer 62 being made of a semiconductor material having a band gap lower than that of the material forming the upper and lower portions 26, 30.

Semiconductor layers and portions 20, 26, 30, 62, 64 are, at least partly, made up of at least one semiconductor material. The semiconductor material is selected from the group comprising III-V compounds, for example, a III-N compound, II-VI compounds, or group-IV semiconductors or compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Examples of group-IV semiconductor materials are silicon (Si), carbon (C), germanium (Ge), silicon carbide alloys (SiC), silicon-germanium alloys (SiGe), or germanium carbide alloys (GeC). Semiconductor layers and portions 20, 26, 30, 62, 64 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

Each barrier layer 64 may be made of the same material as that of the upper and lower portions 26, 30, particularly non-intentionally doped. According to an embodiment, each quantum well layer 62 comprises the same III-V or II-VI compound as that forming upper and lower portions 26, 30 and further comprises an additional element. According to an embodiment, when upper and lower portions 26, 30 are made of GaN, each quantum well layer 64 may be made of InGaN with a mass concentration of In in the range from 10% to 30%. The thickness of each quantum well layer 62 may be in the range from 3 nm to 10 nm. The thickness of each barrier layer 64 may be in the range from 3 nm to 50 nm.

According to an embodiment, the mass concentration of the additional element in the quantum well layer 64 closest to upper semiconductor portion 26 is different from the mass concentration of the additional element in the quantum well layer 64 closest to lower semiconductor portion 30. According to an embodiment, the difference between the mass concentration of the additional element in the quantum well layer 64 closest to upper semiconductor portion 26 and the mass concentration of the additional element in the quantum well layer 64 closest to lower semiconductor portion 30 is greater than 10 percentage points.

According to an embodiment, upper semiconductor portion 26 is predominantly made of a III-N compound, for example, gallium nitride, doped with a first conductivity type, for example, N-type doped. The N-type dopant may be silicon. The dopant concentration of upper semiconductor portion 26 may be in the range from $10^{17}$ atoms/cm$^3$ to $5*10^{20}$ atoms/cm$^3$. According to an embodiment, the lower semiconductor portion 30 is for example at least partly made of a III-N compound, for example, gallium nitride. Portion 30 may be doped with the second conductivity type, for example, type P. The dopant concentration of lower semiconductor portion 30 may be in the range from $10^{17}$ atoms/cm$^3$ to $5*10^{20}$ atoms/cm$^3$. Lower semiconductor portion 30 may comprise a stack of at least two semiconductor layers 30 of the same material with different mass concentrations of dopants, the layer most distant from active area 28 being the most heavily doped.

Each optoelectronic device 10, 55, 60 may further comprise an electron blocking layer 66 interposed between active area 28 and P-type doped semiconductor portion 30, preferably in contact with active area 28 and P-type doped semiconductor portion 30. Electron blocking layer 66 provides a good distribution of electric carriers in active area 28 and decreases the diffusion of electrons towards P-type doped semiconductor portion 30. Electron blocking layer 66 may be formed of a ternary alloy, for example, aluminum gallium nitride (AlGaN) or aluminum indium nitride (AlInN). The thickness of electron blocking layer 66 may be in the order of 20 nm.

Conductive layer 38 preferably corresponds to a metal layer, for example, aluminum, silver, copper, titanium, titanium nitride, or zinc. The material forming conductive layer 38 may be a conductive material at least transparent to the radiation emitted by light-emitting diode DEL, such as indium tin oxide (ITO), zinc oxide, doped or not with aluminum or gallium, or graphene. The thickness of conductive layer 38 may be in the range from 0.5 μm to 10 μm.

Each insulating layer 36, 40 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (SiO$_x$N$_y$, where x may be approximately equal to ½ and y may be approximately equal to 1, for example, Si$_2$ON$_2$), of aluminum oxide (Al$_2$O$_3$), or of hafnium oxide (HfO$_2$). The minimum thickness of insulating layer 36 in the portions where it covers the lateral walls 34 of light-emitting diodes DEL may be in the range from 1 nm to 10 μm. Insulating layer 40 may be made of an organic material. As an example, insulating layer 36 is a silicone polymer, an epoxy polymer, an acrylic polymer, or a polycarbonate, a white resin, a black resin, or a transparent resin filled, particularly, with titanium oxide particles.

Each conductive pad 42, 44, 46, 48, 50, 52 may be at least partly made of a material selected from the group comprising copper, titanium, tantalum, tungsten, or their associated nitrides, nickel, gold, tin aluminum, and alloys of at least two of these compounds.

According to an embodiment, at least some of the light-emitting diodes DEL may be covered with a photoluminescent layer comprising luminophores capable, when they are excited by the light emitted by the associated light-emitting diode DEL, of emitting light at a wavelength different from the wavelength of the light emitted by the associated light-emitting diode DEL. Preferably, no light-emitting diode DEL is covered with a photoluminescent layer.

In the embodiments illustrated in FIGS. 2 and 3, each upper semiconductor portion 26 and possible each lower semiconductor portion 30 has an elongated shape, for example, cylindrical, conical, or frustoconical, along a preferred direction, having at least two dimensions, called minor dimensions, in the range from 5 nm to 2.5 μm, preferably from 50 nm to 2.5 μm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 μm, preferably in the range from 100 nm to 1 μm, more preferably from 100 nm to 800 nm. In certain embodiments, the height of each semiconductor portion 26 may be greater than or equal to 500 nm, preferably in the range from 1 μm to 20 μm. The base of upper semiconductor portion 26 has, for example, an oval, circular, or polygonal shape, particularly triangular, rectangular, square, or hexagonal.

Simulations of the operation of a light-emitting diode DEL have been performed with the structure of the light-emitting diode DEL shown in FIG. 4. Light-emitting diode DEL had a structure with a symmetry of revolution. FIG. 4 is a cross-section view of half of light-emitting diode DEL, the axis of ordinates corresponding to the axis of revolution of light-emitting diode DEL. For the simulations, the semiconductor portions 26 and 30 of light-emitting diode DEL are cylinders having a circular base with a radius equal to 5 μm. Upper semiconductor portion 26 and semiconductor portion 20 is made of N-type doped GaN with a dopant concentration equal to $10^{19}$ atoms/cm$^3$. Lower semiconductor layer 30 is made of P-type doped GaN with a $10^{19}$ atoms/cm$^3$ dopant concentration. Active area 28 comprises multiple quantum wells comprising an alternation of InGaN layers 62, each having a mass concentration of indium of 16% and a thickness equal to 3 nm, and of GaN layers 64, non-intentionally doped, each having a thickness equal to 10 nm. Active area 28 comprised five InGaN layers 62 and six GaN layers 64, the layer of active area 28 closest to lower semiconductor portion 30 and the layer of active area 28 closest to upper semiconductor portion 26 being one of barrier layers 64. Light-emitting diode DEL further comprised an AlGaN electron blocking layer 66 having a mass concentration of aluminum equal to 20%, having a thickness equal to 20 nm and located between lower semiconductor portion 30 and active area 28. Insulating layer 36, when present in the simulations, is made of SiO$_2$ and has a 3-nm thickness. The cathode C of light-emitting diode DEL is simulated by a first constant potential taken as equal to 0 V, applied to the surface 32 of lower semiconductor portion 30. The anode A of light-emitting diode DEL is simulated by a second constant potential which, unless otherwise specified, is equal to 2.5 V and which is applied to a wall of substrate portion 24. Gate 38, when present in the simulations, is simulated by a third controllable potential applied to insulating layer 36 on the side opposite to lateral wall 34. For the simulations where gate 38 is not present, insulating layer 36 is considered as having an infinite thickness.

For certain simulations, the presence of defects on the lateral walls 34 of light-emitting diode DEL causing an accumulation of electrons on lateral walls 34 by a surface density QssD of non-radiative donor-type traps and/or causing an accumulation of holes on lateral walls 34 by a surface density QssA of acceptor-type traps has been simulated. A donor-type trap is electrically positive as long as it has not trapped an electron and is electrically neutral when it has trapped an electron. An acceptor-type trap is electrically neutral as long as it has not trapped an electron and has a negative charge when it has trapped an electron. For such defects, when they are present, the surface density of traps is $10^{17}$ atoms/cm$^2$, the average recombination time of the trap is $10^{-11}$ s, and the energy of the trap is equal to half the energy of the quantum wells.

Figure 5:
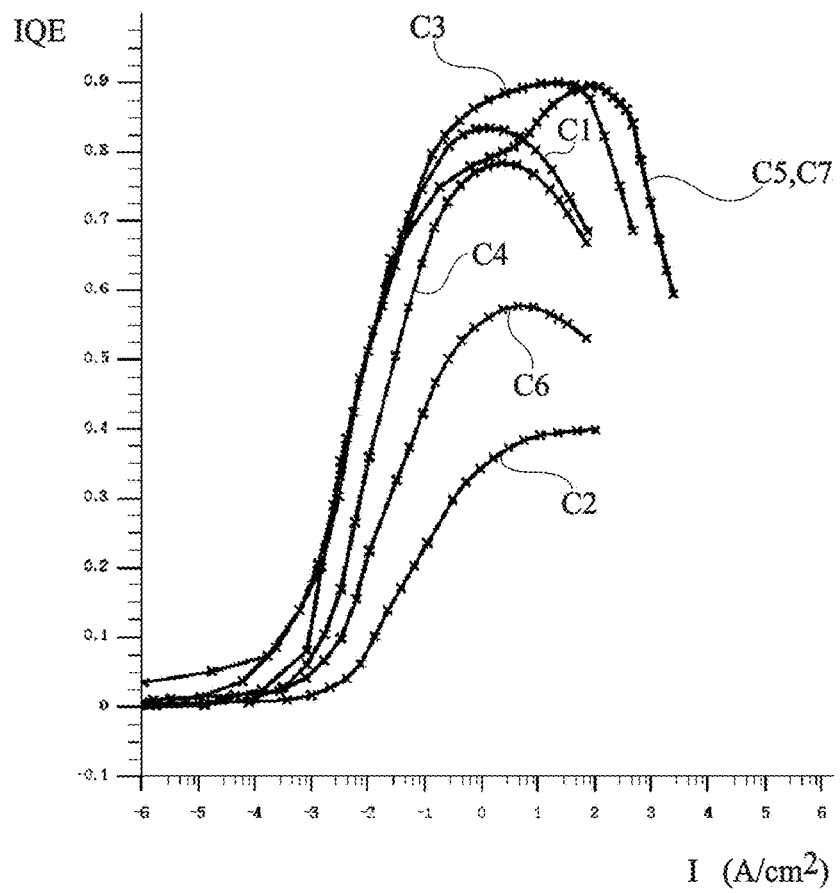
FIG. 5 shows curves of the variation of the internal quantum efficiency of the light-emitting diode of FIG. 4 according to the surface density of current flowing through the light-emitting diode.

FIG. 5 shows curves C1 to C6 of the variation of the internal quantum efficiency IQE of the active area 28 of light-emitting diode DEL, as shown in FIG. 4, according to the surface density of the power supply current I supplied to anode A and expressed in A/cm$^2$ according to a logarithmic scale. The internal quantum efficiency, IQE, is equal to the ratio of the number of photons created in active area 28 to the number of electrons crossing active area 28. The internal quantum efficiency is a unitless number which varies from 0 to 1.

Figure 6:
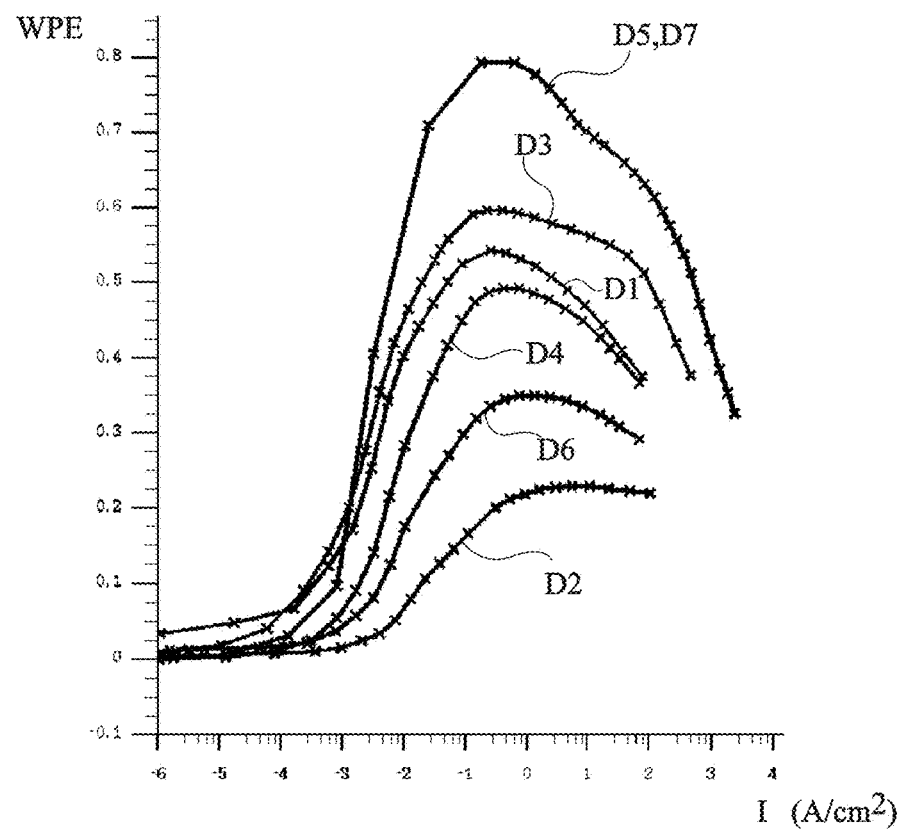
FIG. 6 shows curves of the variation of the wall plug efficiency of the light-emitting diode of FIG. 4 according to the surface density of current flowing through the light-emitting diode.

FIG. 6 shows curves D1 to D6 of the variation of the wall plug efficiency, WPE, of light-emitting diode DEL, as shown in FIG. 4, according to the surface density of the power supply current I supplied to anode A and expressed in A/cm$^2$ according to a logarithmic scale. The wall plug efficiency, WPE, is equal to the ratio of the optical power delivered by the light-emitting diode to the electric power consumed by the light-emitting diode. As compared with internal quantum efficiency IQE, wall plug efficiency WPE takes into account the light extraction efficiency outside of light-emitting diode DEL, the electric injection efficiency, and the power loss between the incident electron and the created photon.

Curves C1 and D1 have been obtained with no gate and no traps. Curves C2 and D2 have been obtained with no gate and with donor-type traps. Curves C3 and D3 have been obtained with no gate and with acceptor-type traps. Curves C4 and D4 have been obtained with no gate and with acceptor-type traps and donor-type traps. Curves C5 and D5 have been obtained without traps and with the gate maintained at −2 V. Curves C6 and D6 have been obtained with donor-type traps and with the gate maintained at −2 V. Curves C7 and D7 have been obtained with acceptor-type traps and with the gate maintained at −2 V.

As shown in the drawing, each variation curve C1 to C7 crosses a maximum before decreasing. The application of a negative voltage to the gate enables, in the case where donor-type traps are present, to increase the maximum IQE value and enables, in the case where acceptor-type traps are present, to keep the maximum IQE value and to put off the IQE decrease.

Figure 7:
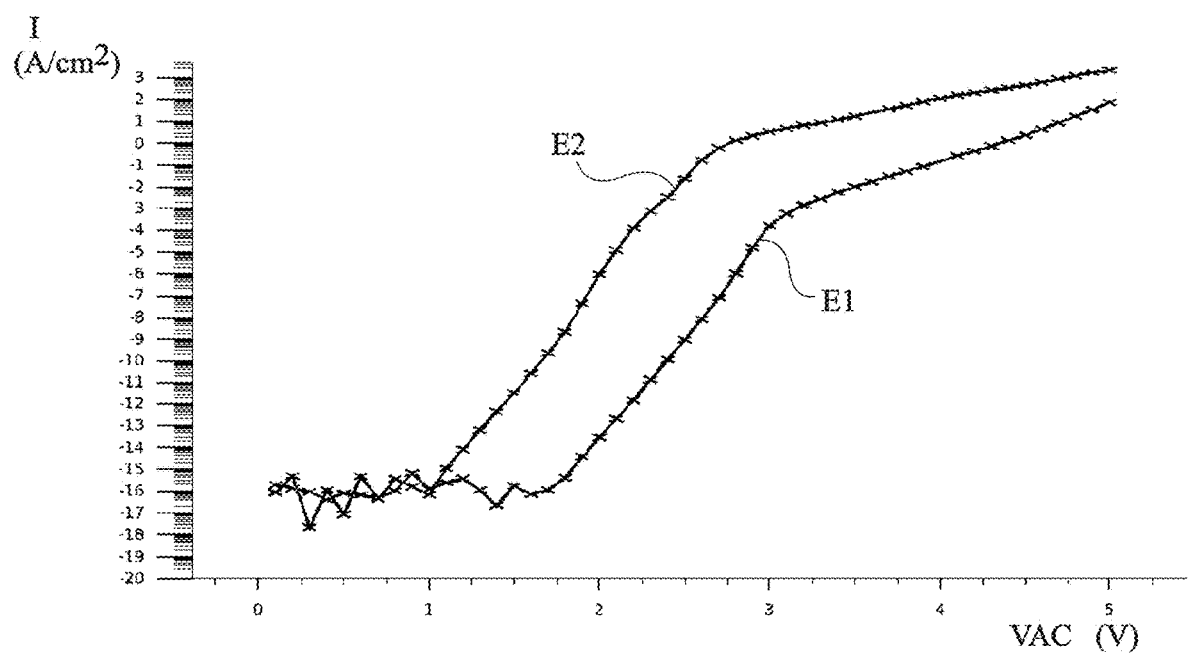
FIG. 7 shows curves of the variation of the surface density of current flowing through the light-emitting diode of FIG. 4 according to the anode-cathode voltage applied to the light-emitting diode.

FIG. 7 shows curves E1 and E2 of the variation of the surface density of current I, expressed in A/cm$^2$ according to a logarithmic scale, flowing through the light-emitting diode according to the anode-cathode voltage VAC applied to light-emitting diode DEL. Curve E1 has been obtained with no traps and with no gate. Curve E2 has been obtained with no traps and with the gate maintained at −2 V. The threshold voltage of the light-emitting diode when the gate is set to −2 V is smaller than the threshold voltage of the light-emitting diode with no gate. Thereby, when the anode-cathode voltage is constant, the intensity of the current flowing through the light-emitting diode, and thus the light power emitted by the light-emitting diode, may be controlled by the voltage applied to gate 38.

According to an embodiment, optoelectronic device 10, 55, 60 comprises light-emitting diodes DEL having a substantially constant anode-cathode voltage applied thereto, and the turning off or the turning on of each of the light-emitting diodes and/or the control of the light power emitted by each of the light-emitting diodes is performed by the control of the voltage applied to the gate 38 of each of the light-emitting diodes. The voltage applied to gate 38, which is to be modulated, is advantageously smaller than the anode-cathode voltage.

Figure 8:
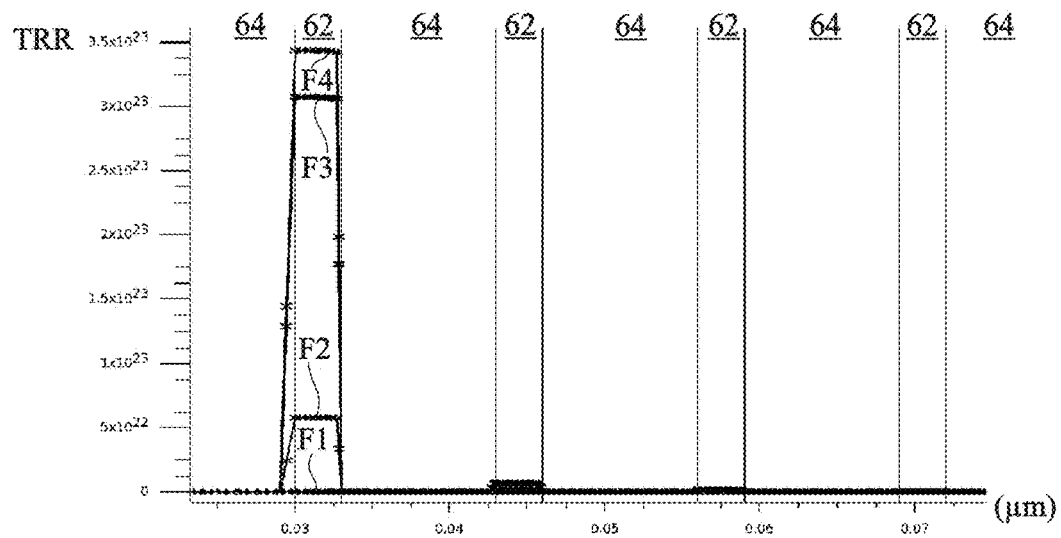
FIG. 8 shows curves of the variation of the radiative recombination rate in the active area of the light-emitting diode of FIG. 4.

FIG. 8 shows, according to the position, curves F1 to F4 of the radiative recombination rate TRR in the layers 62, 64 of the active area 28 of light-emitting diode DEL, only the four quantum well layers 62 closest to the upper N-type doped GaN semiconductor portion 26 being shown, the leftmost quantum well layer 62 in FIG. 8 being the closest to upper N-type GaN semiconductor portion 26. Curves F1 to F4 have been obtained without traps and with a 2.5-V anode-cathode voltage. Curve F1 has been obtained with a 1-V gate voltage. Curve F2 has been obtained with a 0-V gate voltage. Curve F3 has been obtained with a −1-V gate voltage. Curve F4 has been obtained with a −2-V gate voltage. The InGaN layer 62 closest to upper N-type GaN semiconductor portion 26 appears to be activated when the gate voltage decreases.

Figure 9:
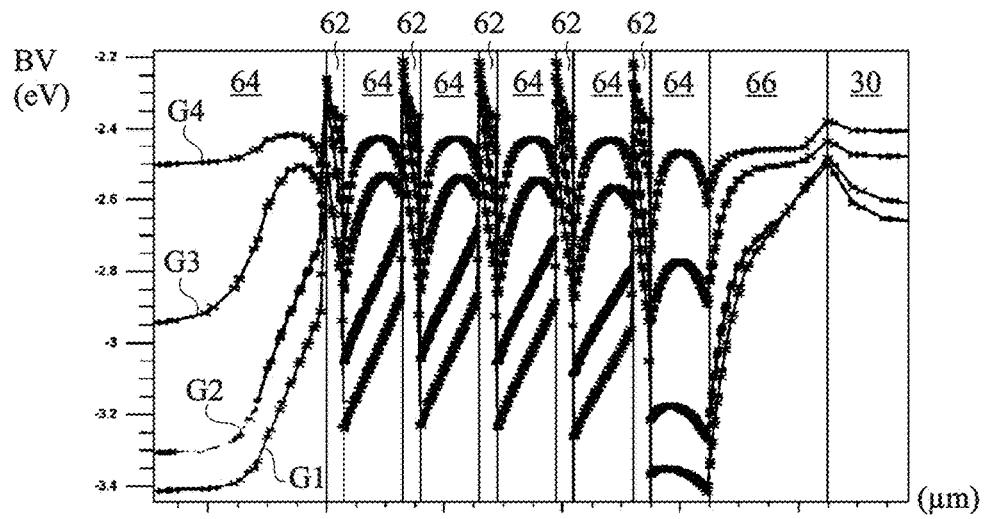
FIG. 9 shows curves of the variation of the energy of the valence band in the active area of the light-emitting diode of FIG. 4.

FIG. 9 shows curves G1, G2, G3, and G4 of the variation of the energy of valence band BV in the layers 62 and 64 of active area 28, in electron blocking layer 66 and in the upper semiconductor portion 30 of the light-emitting diode DEL obtained in the same conditions, respectively, as curves F1, F2, F3, and F4. The application of a negative voltage to gate 38 causes a decrease in the potential barrier seen by the holes originating from lower P-type doped GaN semiconductor portion 30.

Figure 10:
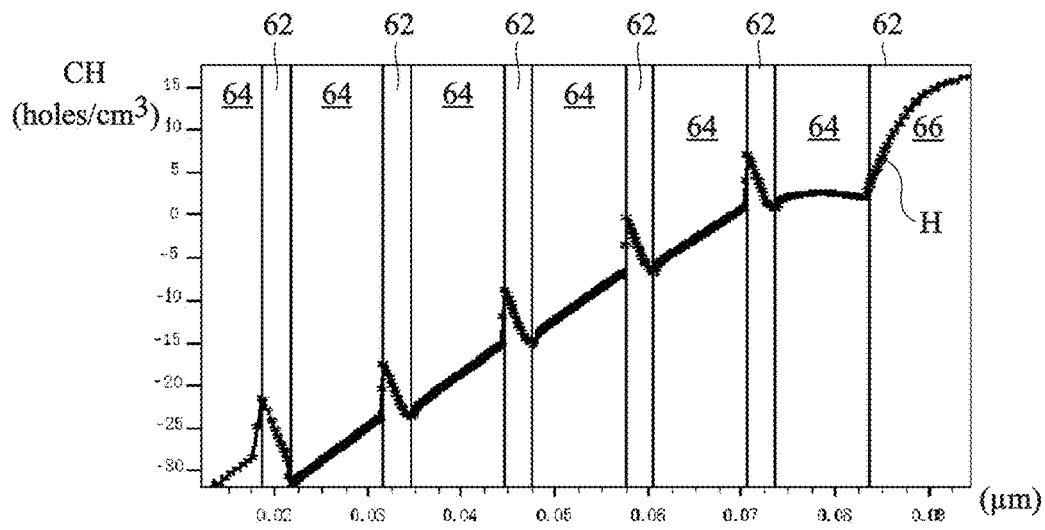
FIG. 10 shows a curve of the variation of the hole concentration in the active area of the light-emitting diode of FIG. 4.

FIG. 10 shows a curve of the variation H of the hole concentration CH, expressed in holes/cm$^3$ according to a logarithmic scale, in the layers 62, 64 of the active area 28 of light-emitting diode DEL. Curve H has been obtained without traps, with a 2.5-V anode-cathode voltage and with no gate. As appears in the drawing, in the absence of a gate, the hole concentration decreases as the distance to P-type doped GaN semiconductor portion 30 increases.

Figure 11:
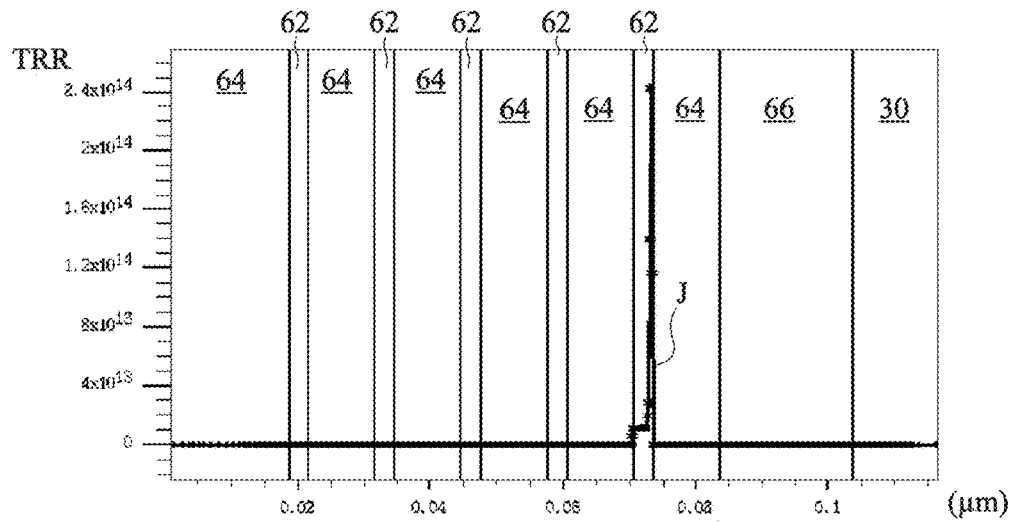
FIG. 11 shows a curve of the variation of the radiative recombination rate in the active area of the light-emitting diode of FIG. 4.

FIG. 11 shows a curve J of the variation of the radiative recombination rate TRR, expressed in number of occurrences/cm$^3$, in the layers 62, 64 of the active area 28, and in the electron block layer 66 of light-emitting diode DEL. Curve H has been obtained without traps, with a 2.5-V anode-cathode voltage and with no gate. As appears in the drawing, in the absence of a gate, only the quantum well 62 closest to P-type doped GaN semiconductor portion 30 is activated.

Figure 12:
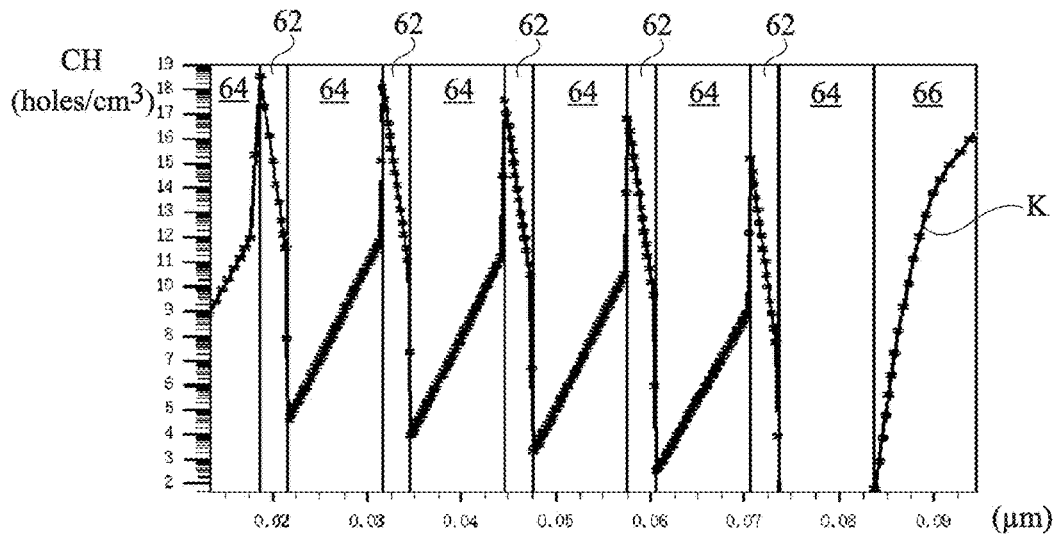
FIG. 12 is similar to FIG. 10.

FIG. 12 shows a curve K of the variation of the hole concentration, expressed in holes/cm$^3$ according to a logarithmic scale, in the layers 62, 64 of the active area 28 of light-emitting diode DEL. Curve K has been obtained without traps, with a 2.5-V anode-cathode voltage and with a −2-V gate voltage. As shown in the drawing, in the presence of gate 38 to which a −2-V voltage is applied, the hole concentration increases as the distance to P-type doped semiconductor GaN portion 30 increases.

Figure 13:
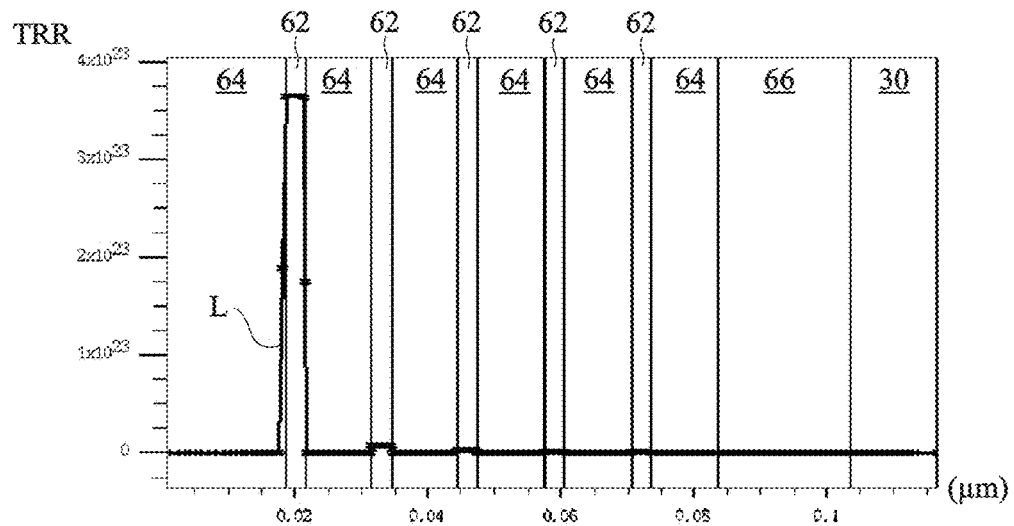
FIG. 13 is similar to FIG. 11.

FIG. 13 shows a curve of the variation L of the radiative recombination rate TRR, expressed in number of occurrences/cm$^3$, in the layers 62, 64 of the active area 28 of light-emitting diode DEL. Curve H has been obtained without traps, with a 2.5-V anode-cathode voltage and with a −2-V gate voltage. As shown in the drawing, in the presence of gate 38 to which a −2-V voltage is applied, substantially only the quantum well 62 closest to P-type doped semiconductor GaN portion 30 is activated.

FIGS. 10 to 13 illustrate the fact that the activated quantum well(s) may be selected by the control of the voltage applied to gate 38. According to an embodiment, at least two quantum wells of each light-emitting diode DEL are capable of emitting electromagnetic radiations at different wavelengths, for example, the quantum well closest to semiconductor portion 26 and the quantum well closest to semiconductor portion 30. This means that at least one first quantum well of each light-emitting diode DEL is capable of emitting a first electromagnetic radiation at a first wavelength and a second quantum well of each light-emitting diode DEL is capable of emitting a second electromagnetic radiation at a second wavelength different from the first wavelength. When the quantum wells are made of InGaN, this may be obtained by forming the quantum wells with different mass concentrations of indium. For a first light-emitting diode, the gate voltage of the first light-emitting diode may be controlled to substantially activate only the first quantum well and, for a second light-emitting diode, the gate voltage of the second light-emitting diode may be controlled to substantially activate only the second quantum well. Two light-emitting diodes of same structure which emit electromagnetic radiations at different wavelengths are thus obtained.

Figure 14:
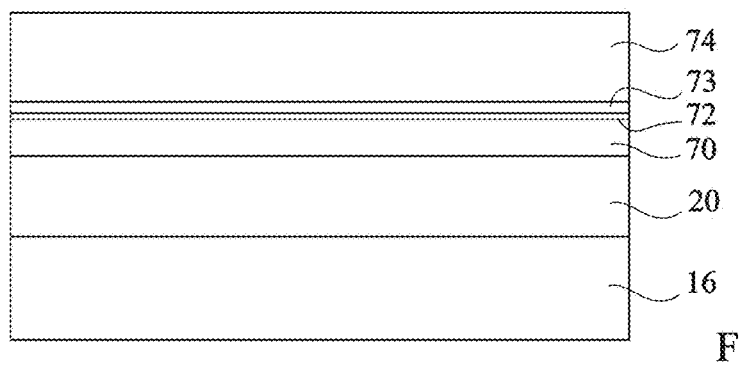
FIG. 14 illustrates a step of an embodiment of a method of manufacturing the optoelectronic device of FIG. 1.

FIGS. 14 to 21 are partial simplified cross-section view of the structures obtained at successive steps of another embodiment of a method of manufacturing the optoelectronic device 10 shown in FIG. 1. The method comprises the steps of:

1) forming, on support 16, for example by epitaxial growth, a stack comprising semiconductor layer 20, a semiconductor layer 70 having the same composition as the previously-described upper semiconductor portion 26, semiconductor layers 72 having the same composition as the semiconductor layers 62, 64 of the previously-described active area 28, a semiconductor layer 73 having the same composition as the previously-described electronic blocking layer 66, and a semiconductor layer 74 having the same composition as the previously-described lower semiconductor portion 30 (FIG. 14).

Figure 15:
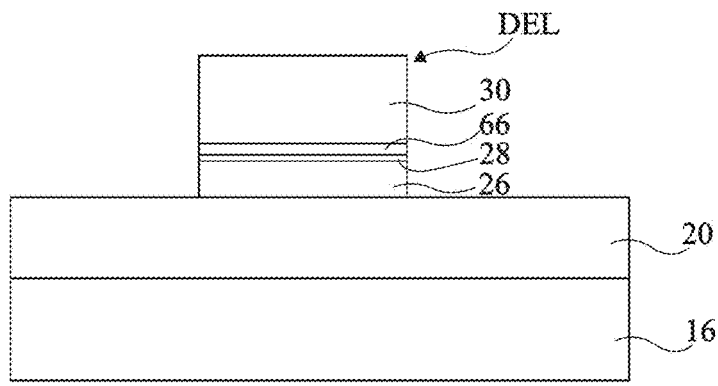
FIG. 15 illustrates another step of the method.

2) etching semiconductor layers 70, 72, 73, and 74 to delimit, for each light-emitting diode DEL, upper semiconductor portion 26, active area 28, electron blocking layer 66, and lower semiconductor portion 30 (FIG. 15).

Figure 16:
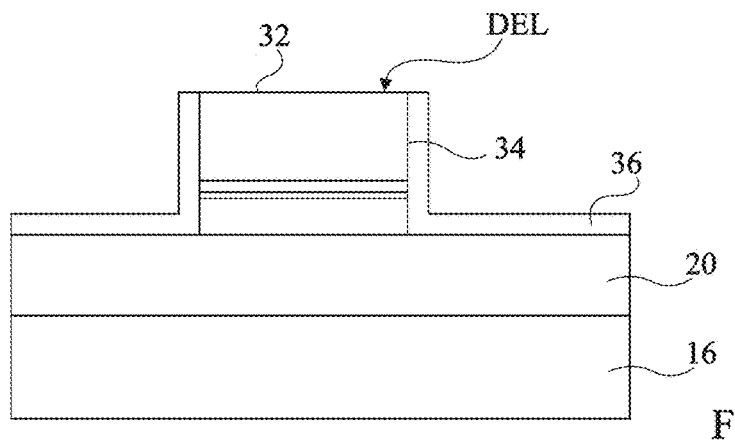
FIG. 16 illustrates another step of the method.

3) forming lateral insulation trenches, not shown, in semiconductor 20 and forming, for each light-emitting diode DEL, insulating layer 36 covering semiconductor layer 20 and the lateral walls 34 of the island and which does not cover the surface 32 of the island (FIG. 16).

Figure 17:
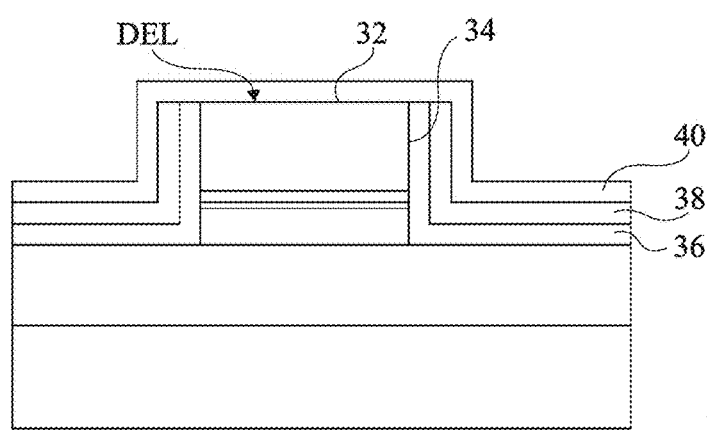
FIG. 17 illustrates another step of the method.

4) forming, for each light-emitting diode DEL, the conductive layer 38 covering insulating layer 36, that is, covering semiconductor layer 20 and the lateral walls 34 of the island and which does not cover the island surface 32, and forming insulating layer 40 covering conductive layer 38 and the surface 32 of each light-emitting diode DEL (FIG. 17)

Figure 18:
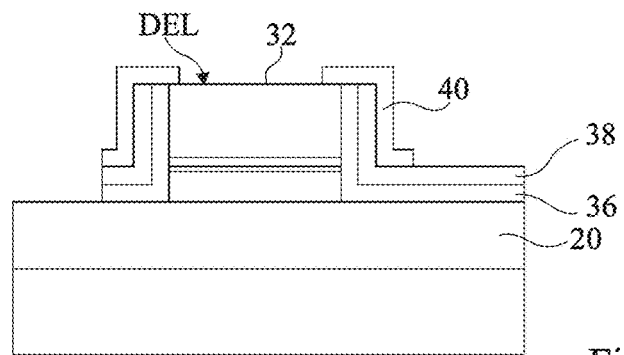
FIG. 18 illustrates another step of the method.

5) etching layers 36, 38, and 40 to expose a portion of the surface 32 of each light-emitting diode DEL, a portion of conductive layer 20, and a portion of layer 38 (FIG. 18).

Figure 19:
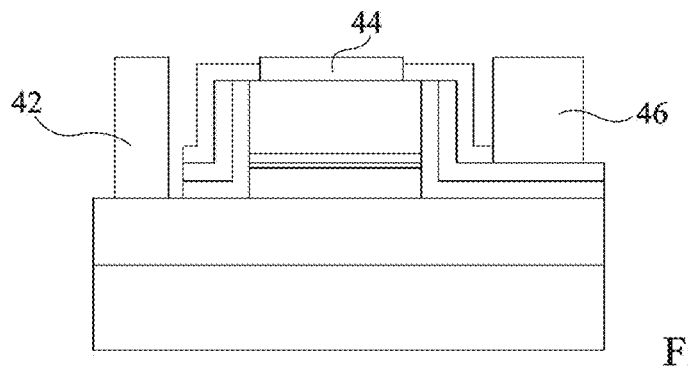
FIG. 19 illustrates another step of the method.

6) forming conductive pads 42, 44, and 46 for each light-emitting diode DEL (FIG. 19).

Figure 20:
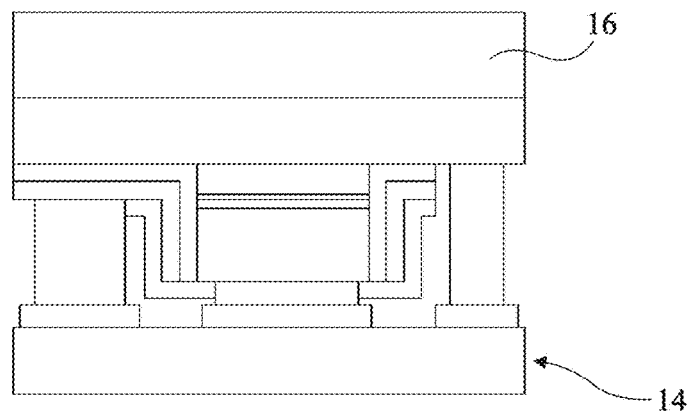
FIG. 20 illustrates another step of the method.
Figure 21:
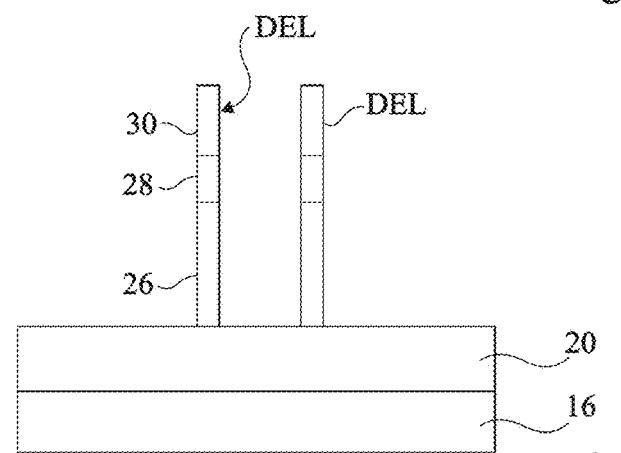
FIG. 21 illustrates a step of an embodiment of a method of manufacturing the optoelectronic device of FIG. 2.

7) bonding the optoelectronic device shown in FIG. 19 to control circuit 14 (FIG. 20).

The method may comprise subsequent steps of removal of support 16 and of cutting to delimit optoelectronic devices 10.

FIGS. 21 to 28 are partial simplified cross-section view of structures obtained at successive steps of another embodiment of a method of manufacturing the optoelectronic device 55 shown in FIG. 2. The method comprises the steps of:

1') forming, on support 16, semiconductor layer 20 and forming, for each substrate portion 24, for example, by epitaxial growth of at least two stacks, each comprising wire-shaped semiconductor portion 26, active area 28, and the previously-described wire-shaped semiconductor portion 30 (FIG. 21), where electron blocking layer 66 is not shown. Examples of methods of growing wire-shaped semiconductor portions are described in U.S. Pat. No. 9,245,948.

Figure 22:
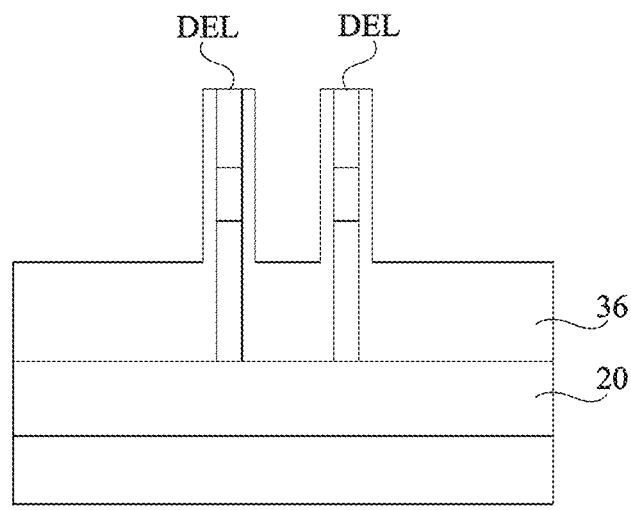
FIG. 22 illustrates another step of the method.

2') forming lateral insulating trenches, not shown, in semiconductor layer 20 and forming, for each group of light-emitting diodes DEL, insulating layer 36 covering semiconductor layer 20 and the lateral walls 34 of the wires (FIG. 22).

Figure 23:
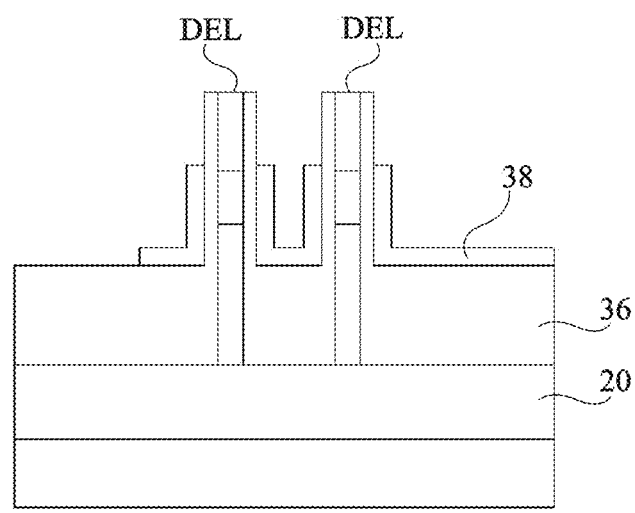
FIG. 23 illustrates another step of the method.

3') forming, for each group of light-emitting diodes DEL, conductive layer 38 covering a portion of insulating layer 36 (FIG. 23).

Figure 24:
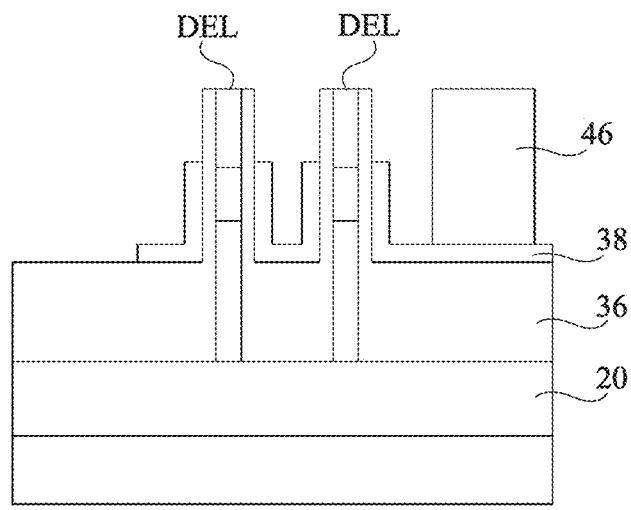
FIG. 24 illustrates another step of the method.

4') forming, for each group of light-emitting diodes DEL, conductive pad 46 in contact with conductive layer 38 (FIG. 24).

Figure 25:
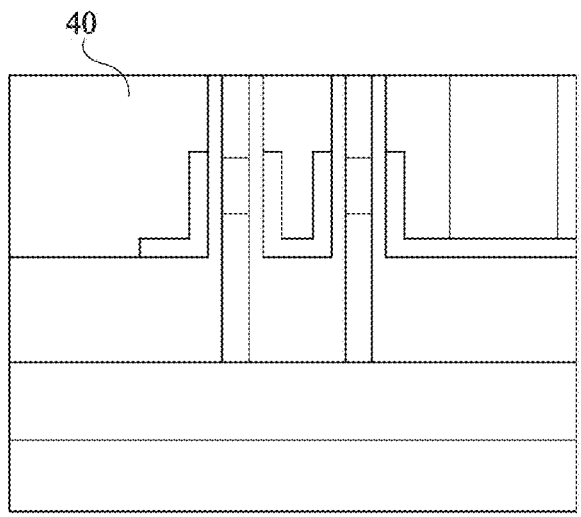
FIG. 25 illustrates another step of the method.

5') forming insulating layer 40 (FIG. 25).

Figure 26:
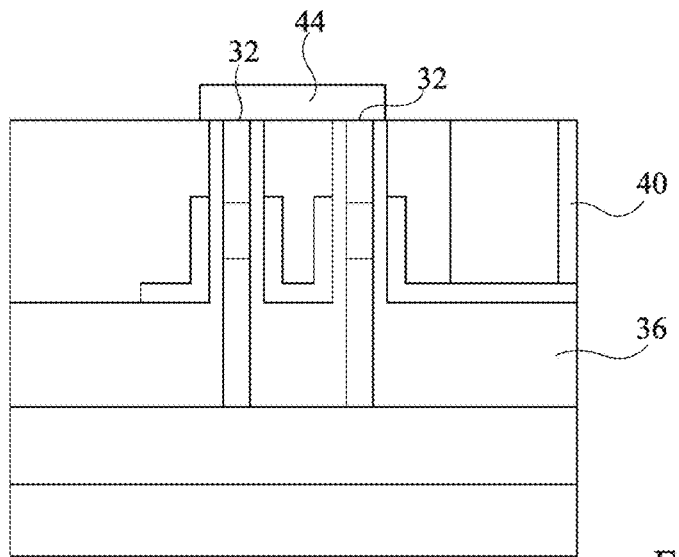
FIG. 26 illustrates another step of the method.

6') forming, for each light-emitting diode DEL, conductive pad 44 in contact with the surface 32 of each wire (FIG. 26).

Figure 27:
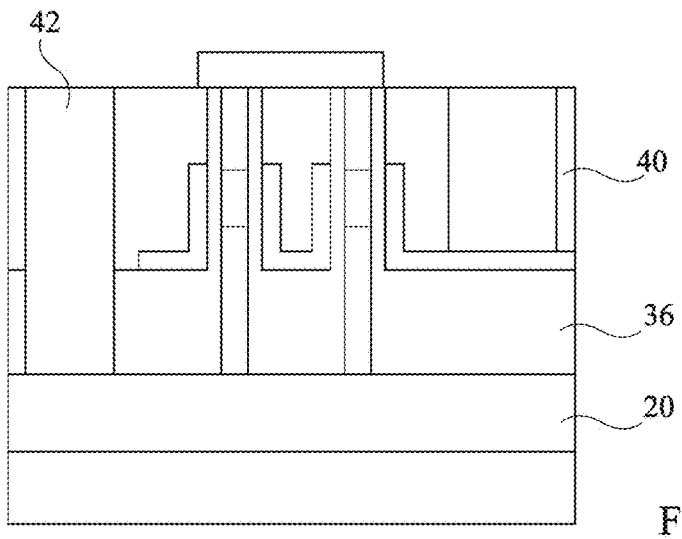
FIG. 27 illustrates another step of the method.

7') forming, for each group of light-emitting diodes DEL, through insulating layers 40 and 36, conductive pad 42 in contact with semiconductor layer 20 (FIG. 27).

Figure 28:
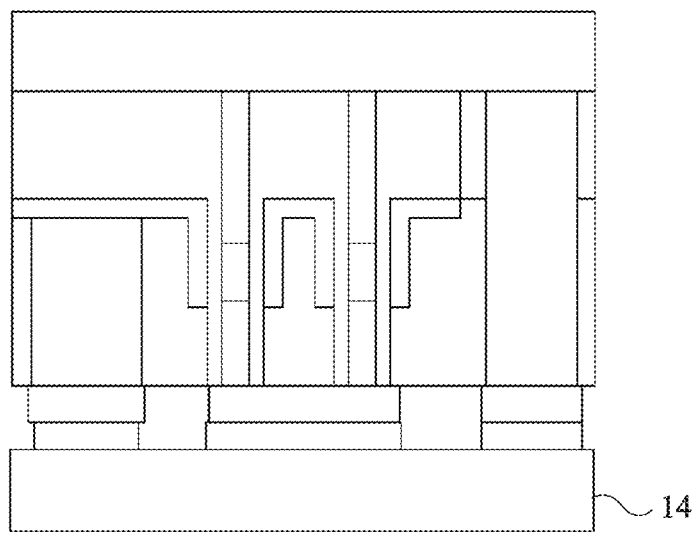
FIG. 28 illustrates another step of the method.
Figure 29:
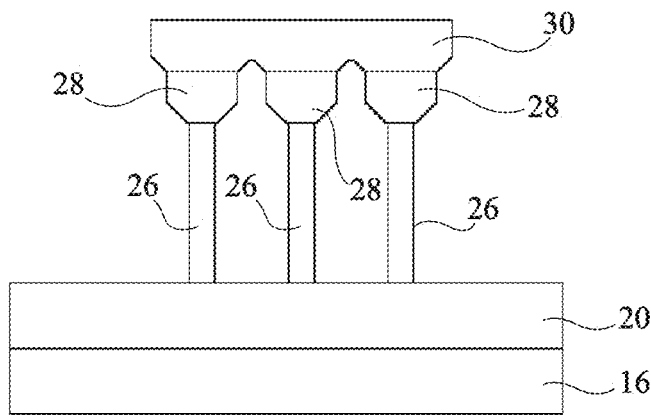
FIG. 29 illustrates a step of an embodiment of a method of manufacturing the optoelectronic device of FIG. 3.

8') bonding the electronic device shown in FIG. 27 to control circuit 14 and removing support 16 (FIG. 28).

FIGS. 29 to 36 are partial simplified cross-section view of structures obtained at successive steps of another embodiment of a method of manufacturing the optoelectronic device 60 shown in FIG. 3. The method comprises the steps of:

1") forming, on support 16, semiconductor layer 20 and, for each group of light-emitting diodes DEL, at least two stacks, three stacks being shown, each comprising wire-shaped semiconductor portion 26, flared active area 28, and forming semiconductor portion 30 in contact with active areas 28 (FIG. 29), where electronic blocking layer 66 is not shown.

Figure 30:
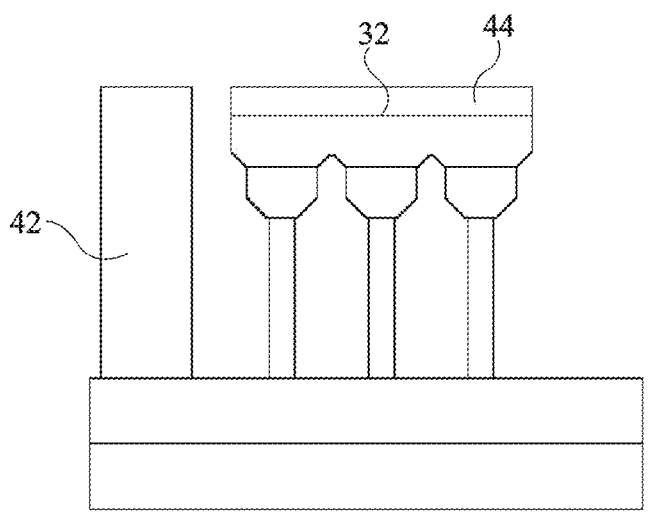
FIG. 30 illustrates another step of the method.

2") forming lateral insulation trenches, not shown, in semiconductor layer 20 and forming, for each group of light-emitting diodes DEL, conductive pad 42 in contact with semiconductor layer 20 and conductive pad 44 in contact with surface 32 (FIG. 30).

Figure 31:
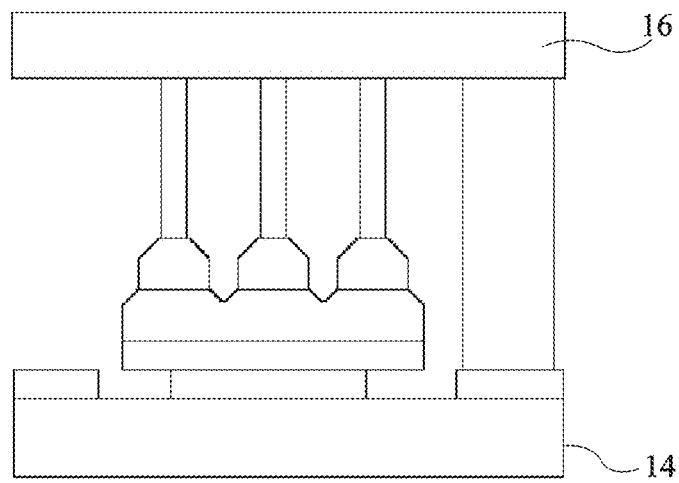
FIG. 31 illustrates another step of the method.

3") bonding the optoelectronic device shown in FIG. 30 to control circuit 14 (FIG. 31).

Figure 32:
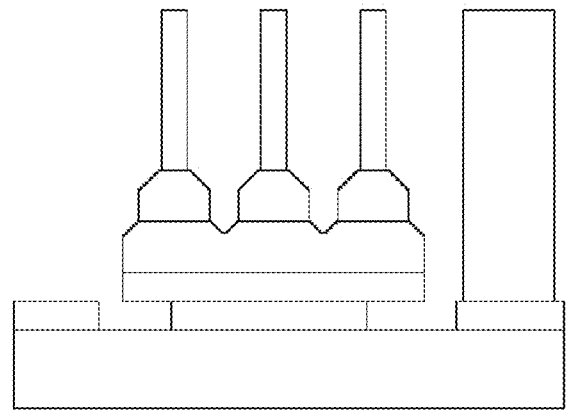
FIG. 32 illustrates another step of the method.

4") removing substrate 16 (FIG. 32).

Figure 33:
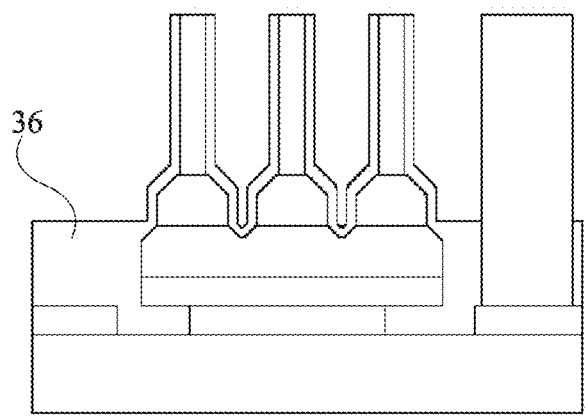
FIG. 33 illustrates another step of the method.

5") forming, for each group of light-emitting diodes DEL, insulating layer 36 (FIG. 33).

Figure 34:
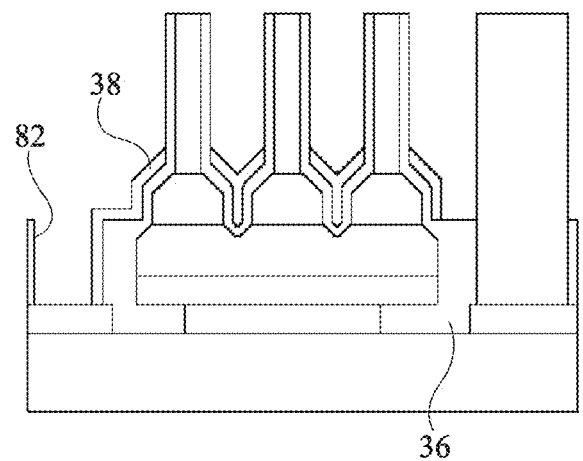
FIG. 34 illustrates another step of the method.

6") forming, for each group of light-emitting diodes DEL, an opening 82 in insulating layer 36 to expose a portion of conductive layer 20, and forming conductive layer 38 covering insulating layer 36 and extending in opening 82 (FIG. 34).

Figure 35:
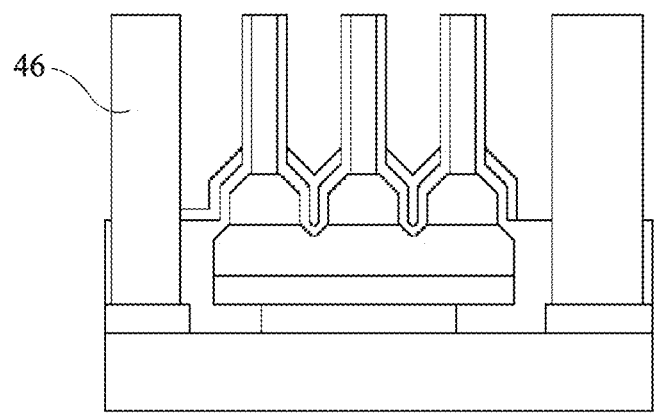
FIG. 35 illustrates another step of the method.

7") forming, for each group of light-emitting diodes DEL, conductive pad 46 in contact with conductive layer 38 in opening 82 (FIG. 35).

Figure 36:
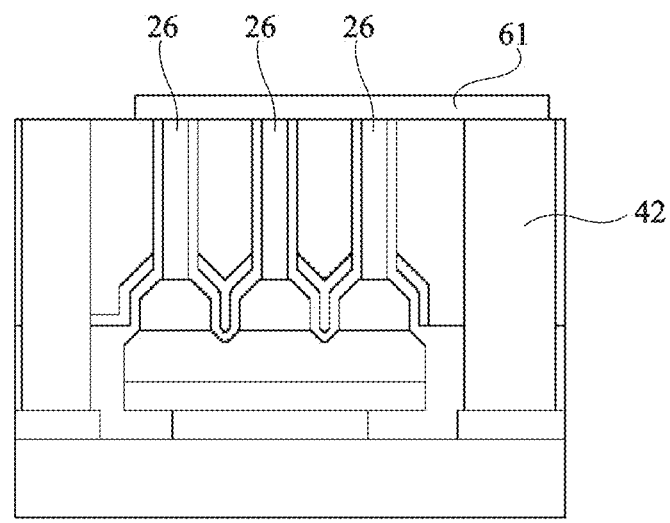
FIG. 36 illustrates another step of the method.

8") forming, for each group of light-emitting diodes DEL, conductive element 61 coupling conductive pad 42 to semiconductor portions 26 (FIG. 36).

Various embodiments and variants have been described. It will be understood by those skilled in the art that certain features of these various embodiments and variants may be combined, and other variants will occur to those skilled in the art. In particular, in the previously-described embodiments, the assembly comprising a gate 38 and insulating layer 36 may be replaced with one or a plurality of metal portions forming one or a plurality of Schottky contacts with the materials of the quantum wells. In this case, the metal portion(s) are directly in contact with the semiconductor materials of the quantum wells, with no insulation material arranged between the semiconductor materials and the metallic material. To form such a Schottky contact, the metal used is preferably selected from metals having a significant work function, such as for example tungsten, which has a work function equal to approximately 6.1 eV, or platinum. The selection of the material used to form such Schottky contacts particularly depends on the semiconductor materials used. Finally, the practical implementation of the embodiments and variants described herein is within the capabilities of those skilled in the art based on the functional description provided hereinabove.

The invention claimed is:

1. An optoelectronic device comprising at least first and second light-emitting diodes, each comprising a first P-type doped semiconductor portion and a second N-type doped semiconductor portion, an active area comprising multiple quantum wells between the first and second semiconductor portions, a conductive layer covering the lateral walls of the active area and at least a portion of the first semiconductor portion and an insulating layer interposed between the lateral walls of the active area and of at least a portion of the conductive layer, the device comprising means for controlling the conductive layer of the first light-emitting diode independently from the conductive layer of the second light-emitting diode, the optoelectronic device comprising, for each of the first and second light-emitting diodes, a first conductive pad electrically coupled to the first semiconductor portion, a second conductive pad electrically coupled to the second semiconductor portion, and a third conductive pad electrically coupled to the conductive layer;

wherein, for each active area, the composition of the first quantum well closest to the first semiconductor portion is different from the composition of the second quantum well closest to the second semiconductor portion.

2. The optoelectronic device according to claim 1, wherein, for each active area, each quantum well comprises a ternary alloy with first, second, and third chemical elements, wherein the mass concentrations of the first chemical element of the quantum wells are identical, wherein the mass concentrations of the second chemical element of the quantum wells are identical, and wherein the mass concentration of the third chemical element of the quantum well closest to the first semiconductor portion is different from the mass concentration of the third chemical element of the quantum well closest to the second semiconductor portion.

3. The optoelectronic device according to claim 2, wherein the difference between the mass concentration of the third chemical element of the quantum well closest to the first semiconductor portion and the mass concentration of the third chemical element of the quantum well closest to the second semiconductor portion is greater than 10 percentage points.

4. The optoelectronic device according to claim 2, wherein the first chemical element is a group-III element.

5. The optoelectronic device according to claim 2, wherein the first chemical element is gallium.

6. The optoelectronic device according to claim 2, wherein the second chemical element is a group-V element.

7. The optoelectronic device according to claim 2, wherein the second chemical element is nitrogen.

8. The optoelectronic device according to claim 2, wherein the third chemical element is a group-III element.

9. The optoelectronic device according to claim 2, wherein the third chemical element is indium.

10. The optoelectronic device according to claim 1, wherein each light-emitting diode has a "mesa" structure.

11. The optoelectronic device according to claim 1, wherein, for each light-emitting diode, the second semiconductor portion is wire-shaped.

12. The optoelectronic device according to claim 1, wherein each light-emitting diode further comprises, between the active area and the first semiconductor portion, an electron blocking layer.

13. The optoelectronic device according to claim 1, wherein the first and second conductive pads are electrically insulated from the conductive layer.

14. A method of light emission from the optoelectronic device according to claim 1, comprising the application of a first electric voltage between the first and second semiconductor portions of each of the first and second light-emitting diodes, the application of a second electric voltage between the conductive layer and the first semiconductor portion of the first light-emitting diode, and the application of a third electric voltage between the conductive layer and the first semiconductor portion of the second light-emitting diode, the third electric voltage being different from the second electric voltage.

15. The optoelectronic device according to claim 1, wherein for the first light-emitting diode, the gate voltage of the first light-emitting diode is controlled to activate only the first quantum well and, for the second light-emitting diode, the gate voltage of the second light-emitting diode is controlled to activate only the second quantum well.

* * * * *